(12) United States Patent
Nakashima

(10) Patent No.: US 6,445,056 B2
(45) Date of Patent: Sep. 3, 2002

(54) SEMICONDUCTOR CAPACITOR DEVICE

(75) Inventor: Yuuji Nakashima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/755,862

(22) Filed: Jan. 5, 2001

(30) Foreign Application Priority Data

Jan. 5, 2000 (JP) ........................................ 2001-000491

(51) Int. Cl.$^7$ .......................... H01L 29/00; H01L 29/40; H01L 29/92
(52) U.S. Cl. .......................... 257/532; 257/758; 257/773
(58) Field of Search ................................. 257/750, 758, 257/773, 776, 532

(56) References Cited

U.S. PATENT DOCUMENTS 5,583,359 A * 12/1996 Ng et al. ..................... 257/306
5,789,791 A * 8/1998 Bergemont ................. 257/401
6,100,591 A * 8/2000 Ishii ............................ 257/773

FOREIGN PATENT DOCUMENTS

| JP | 61-263251 | 11/1986 | | |
|---|---|---|---|---|
| JP | 5-121207 | 5/1993 | | |
| JP | 7-297675 A | * 11/1995 | ............ | H03H/9/64 |
| JP | 11-168173 | 6/1999 | | |

* cited by examiner

Primary Examiner—Allan R. Wilson
(74) Attorney, Agent, or Firm—Scully, Scott, Murphy & Presser

(57) ABSTRACT

A semiconductor device comprising: a first interconnect layer 1 comprising a first electrode 10 and a second electrode 20 with a plurality of a tooth-shaped teeth 11, 21 and a connection portion 12, 22 for connecting the plurality of teeth, the first electrode 10 and the second electrode 20 being disposed in a mutually staggered fashion from opposite directions; a second interconnect layer 2 comprising a third electrode 30 and a fourth electrode 40 with a plurality of tooth-shaped teeth 31, 41 and a connection portion 32, 42 for connecting the plurality of teeth, the third electrode 30 and the fourth electrode 40 being disposed in mutually staggered fashion from opposite directions; wherein the teeth 11 of the first electrode 10 overlap with either teeth 31 of the third electrode 30 or teeth 41 of the fourth electrode 40, and the electrodes are connected so that potentials on the overlapping teeth are different.

10 Claims, 4 Drawing Sheets

SEMICONDUCTOR CAPACITOR DEVICE

BACKGROUND OF THE INVENTION

1. Field of the Invention

The present invention relates to a semiconductor device, and more particularly to capacitor having a high dielectric withstanding voltage formed on a semiconductor substrate, and having a large capacitance formed within a small surface area.

2. Related Art

A capacitative element formed on a semiconductor device must achieve a large capacitance within a small region. To achieve this object, one method that is used is that of forming a capacitative element simultaneously with the formation of the usual MOS transistor. However, with advances in the shrinking of the design rule in semiconductor devices, the gate oxide film thickness has become thin, and if the above method is applied to form a capacitative element added for the purpose of achieving uniform pad terminal capacitances, the ESD (Electric Static Discharge) withstand voltage becomes low, and for this reason, there was a need to form a capacitative element having a sufficient degree of ESD withstanding voltage in a small surface area.

Accordingly, it is an object of the present invention, to improve on the above-noted drawbacks of the prior art, to provide a novel semiconductor device which enables the formation of capacitative element having ESD withstanding voltage in a small surface area.

SUMMARY OF THE INVENTION

In order to achieve the above-noted object, the present invention adopts the following basic technical constitution.

Specifically, the first aspect of a semiconductor device according to the present invention is a semiconductor device comprising: a first interconnect layer comprising a first electrode and a second electrode with a plurality of a tooth-shaped teeth and a connection portion for connecting the plurality of teeth, the first electrode and the second electrode being disposed in a mutually staggered fashion from opposite directions; a second interconnect layer comprising a third electrode and a fourth electrode with a plurality of tooth-shaped teeth and a connection portion for connecting the plurality of teeth, the third electrode and the fourth electrode being disposed in mutually staggered fashion from opposite directions; and an intervening interlayer disposed between the first interconnect layer and the second interconnect layer; wherein the teeth of the first electrode of the first interconnect layer overlap, via the intervening interlayer, with either teeth of the third electrode or teeth of the fourth electrode of the second interconnect layer, and the electrodes are connected so that potentials on the overlapping teeth are different, a capacitative element being formed by the four electrodes.

In the second aspect of the present invention, the electrodes of the first interconnect layer and the electrodes of the second interconnect layer are connected by contact holes provided in the connection portions in each of the electrodes.

In the third aspect of the present invention, a width of the teeth of the first electrode or the second electrode is different from a width of the teeth of the third electrode or the fourth electrode.

In the fourth aspect of the present invention, a width of the teeth of the first electrode or the second electrode is the same as a width of the third electrode or the fourth electrode.

In the fifth aspect of the present invention, a spacing between the teeth of the first electrode and the teeth of the second electrode is smaller than a spacing between the first electrode and the third electrode or the fourth electrode.

In the sixth aspect of the present invention, a spacing between the teeth of the third electrode and the teeth of the fourth electrode is smaller than a spacing between the first electrode and the third electrode or the fourth electrode.

The seventh aspect of the present invention is a semiconductor device comprising: a first interconnect layer comprising a first electrode and a second electrode with a plurality of a tooth-shaped teeth and a connection portion for connecting the plurality of teeth, the first electrode and the second electrode being disposed in a mutually staggered fashion from opposite directions; a second interconnect layer comprising a third electrode and a fourth electrode with a plurality of tooth-shaped teeth and a connection portion for connecting the plurality of teeth, the third electrode and the fourth electrode being disposed in mutually staggered fashion from opposite directions; and an intervening interlayer disposed between the first interconnect layer and the second interconnect layer; wherein the teeth of the first electrode of the first interconnect layer being disposed so as to overlap the teeth of the third electrode or the teeth of the fourth electrode of the second interconnect layer, via the intervening interlayer, and the electrodes of the first interconnect layer and the electrodes of the second interconnect layer are connected by a plurality of contact holes provided in each of the teeth of the electrodes, a capacitative element being formed by these four electrodes.

In the eighth aspect of the present invention, the electrodes of the first interconnect layer and the electrodes of the second layer are connected by contact holes provided in the each connect portion of the electrodes.

In the ninth aspect of the present invention, a spacing between the contact holes connecting the teeth of the first electrode and the teeth of the fourth electrode and the contact holes connecting the teeth of the second electrode and the teeth of the third electrode is smaller than a spacing between the first electrode and the third electrode or the fourth electrode.

BRIEF DESCRIPTIONS OF THE DRAWINGS

DETAILED DESCRIPTION OF THE PREFERRED EMBODIMENTS

Preferred embodiments of a semiconductor device according to the present invention are described in detailed below, with references being made to relevant accompanying drawings.

Figure 1:
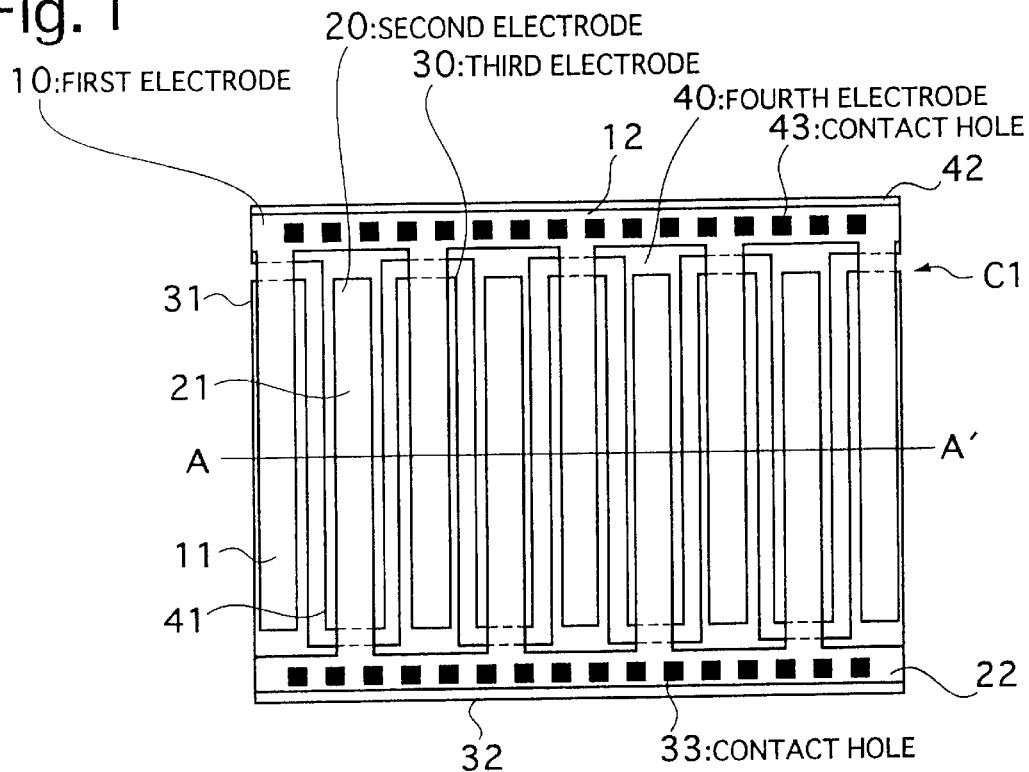
FIG. 1 is a plan view of a first embodiment of semiconductor according to the present invention.
Figure 2:
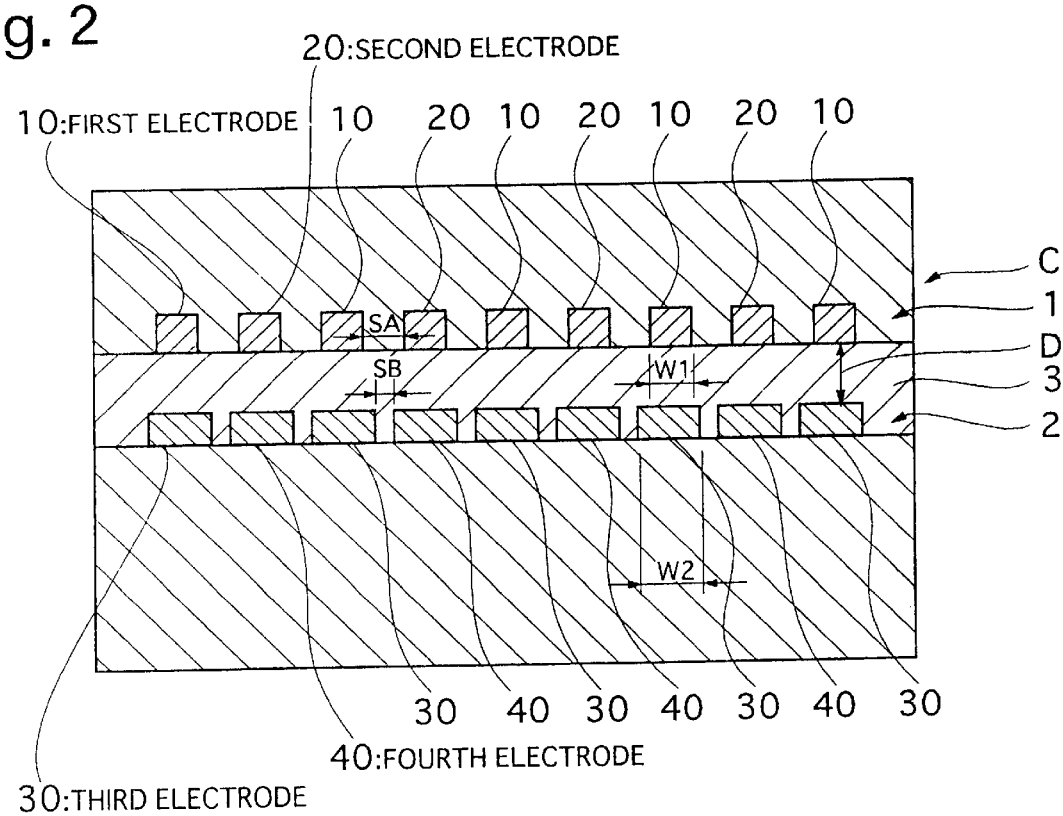
FIG. 2 is a cross-sectional view of FIG. 1.

FIG. 1 is a plan view showing the construction of a first embodiment of a semiconductor device according to the present invention, and FIG. 2 is a cross-sectional view thereof, along the cutting line A–A'.

These drawings shows a semiconductor device provided with a first interconnect layer 1 having a first electrode 10 and a second electrode 20, and a second interconnect layer 2 having a third electrode 30 and a fourth electrode 40. The first electrode 10 has a plurality of teeth 11 and a connection portion 12 connecting the plurality of teeth 11, the second electrode 20 has a plurality of teeth 21 and a connection portion 22 connecting the plurality of teeth 21, the first electrode 10 and the second electrode 20 are disposed so as to be mutually staggered from opposite directions.

The third electrode 30 has a plurality of teeth 31 and a connection portion 32 connecting the plurality of teeth 31, the fourth electrode 40 has a plurality of teeth 41 and a connection portion 42 connecting the plurality of teeth 41, the third electrode 30 and the fourth electrode 40 are disposed so as to be mutually staggered from opposite directions.

The teeth 11 of the first electrode 10 of the first interconnect layer 1 overlap, via an intervening interlayer film 3, with the teeth 31 of the third electrode 30 or the teeth 41 of the fourth electrode 40 of the second interconnect layer 2, connection being made to the electrodes such that the potentials of each of the overlapped teeth is different, a capacitative element being formed by the four electrodes 10 through 40.

The connection portion 12 of the first electrode 10 of the first interconnect layer 1 and the connection portion 42 of the fourth electrode 40 of the second interconnect layer 2 are connected via contact holes 43 provided in the connection portions 12,42.

The connection portion 22 of the second electrode 20 of the first interconnect layer 1 and the connection portion 32 of the third electrode 30 of the second interconnect layer 2 are connected via contact holes 33 provided in the connection portions 22,32.

The width W1 of the teeth 11 and 21 of the first electrode 10 and the second electrode 20 is different from the width W2 of the teeth 31 and 41 of the third electrode 30 and the fourth electrode 40.

Additionally, the spacing SA between the teeth 11 of the first electrode 10 and the teeth 21 of the second electrode 20 is smaller than the spacing D between the first electrode 10 and the third electrode 30 or the fourth electrode 40, and the spacing SB between the, teeth 31 of the third electrode 30 and the teeth 41 of the fourth electrode 40 is smaller than the spacing D between the first electrode 10 and the third electrode 30 or the fourth electrode 40.

The first embodiment of the present invention is described in further detail below.

The semiconductor device shown in FIG. 1 and FIG. 2 has two conductors 30 and 40 formed on the same layer, on which an interlayer film 3 that has been subjected to flattening processing is provided, and two conductors 10 and 20 being formed on the interlayer film 3, thereby constituting a capacitative element C1.

The conductors 10 through 40 have tooth-shaped teeth and the conductors 10 and 20 are mutually staggered from opposite directions, and the conductors 30 and 40 are mutually staggered from opposite directions. In order that the conductors 10, 20 and the conductors 30, 40 is formed parallel each other , they are provided so as to sandwich the interlayer film 3 having a film thickness D and being flattened. Additionally, connections are made so that the potentials on the conductors 10 and 40 is the same and the potentials on the conductors 20 and 30 is the same, thereby a capacitative element C1 being formed between these conductors.

FIG. 2 is a cross-sectional view along the cutting line A–A' of FIG. 1.

The conductor 10 and conductor 40 are connected by contact 43 and the conductor 20 and the conductor 30 are connected by a contact 33.

Figure 3:
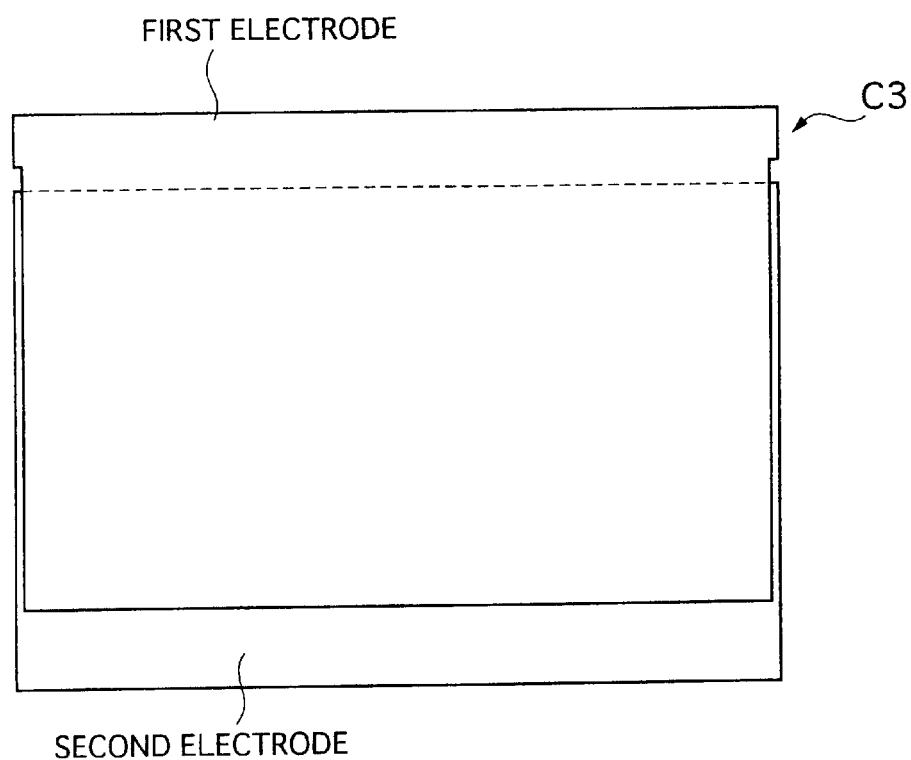
FIG. 3 is a plan view showing a comparison example of the first embodiment.

When the relationship between the interconnect spacing SA between the conductors 10 and 20 or the interconnect spacing SB between the conductors 30 and 40 and the interconnect film thickness D between the conductor 20 and the conductors 30 or 40 is SA=<D or SB=<D, the capacitance of the capacitative element C1 is larger than the flat-plate capacitative element C3 having the same surface area as FIG. 1 shown in FIG. 3.

For example, taking the example of a recent DRAM, in which D=0.6 $\mu$m, SA=0.52 $\mu$m and SB=0.32 $\mu$m, if the number of teeth of conductors 10 and 30 and the number of teeth of conductors 20 and 40 are 6 and 5, respectively, the capacitance of the capacitative element C1 of the present invention is 21.1 fF.

The capacitance of a capacitative element C3 having a flat-plate construction with the same surface area, on the other hand, would be 7.8 fF.

Additionally, because the interlayer film thickness D, being several thousands Angstroms, this being sufficiently Chick compared to the thickness currently seen in gate oxide films, which range from several tens up to approximately 100 Angstroms, the ESD withstanding voltage is increased.

Additionally, while the above description is for the case in which there is overlap between the first electrode 10 and the third electrode 30, it will be understood that it is alternately possible to have overlap between the first electrode 10 and fourth electrode 40, with the same potential on the first electrode 10 and the third electrode 30 and the same potential on the second electrode 20 and fourth electrode 40.

Additionally, while the above description is for the case in which the width W1 of the teeth 11 and 21 of the first electrode 10 and the second electrode 20 is different from the width W2 of the teeth 31 and 41 of the third electrode 30 and the fourth electrode 40, it is alternately possible that width W1 of the teeth 11 and 21 of the first electrode 10 and the second electrode 20 is same as the width W2 of the teeth 31 and 41 of the third electrode 30 and the fourth electrode 40.

Figure 4:
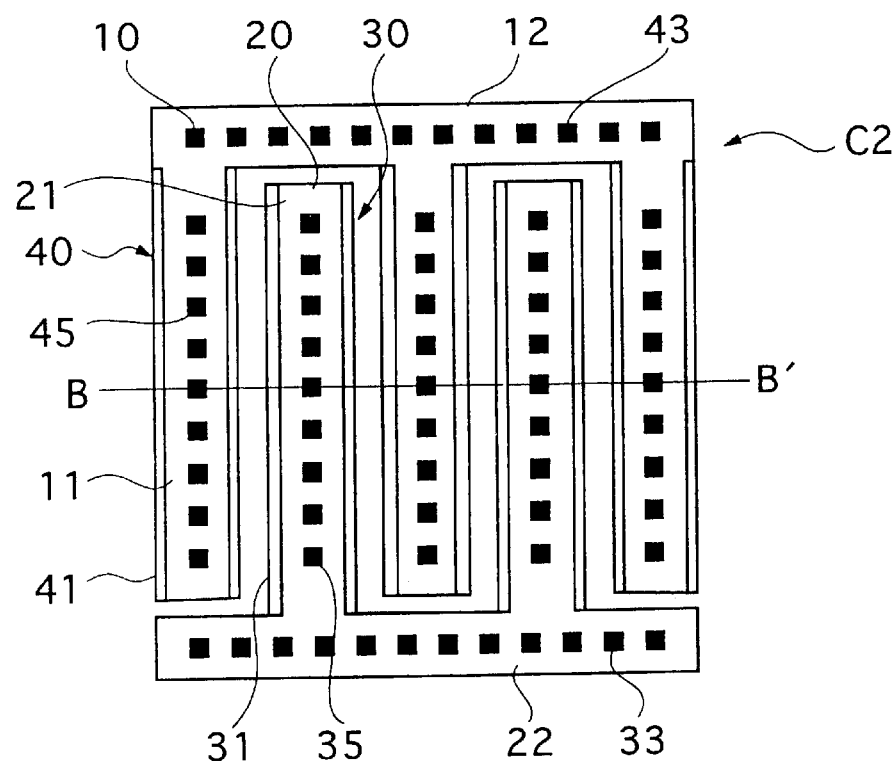
FIG. 4 is a plan view of a second embodiment of a semiconductor device according to the present invention.
Figure 5:
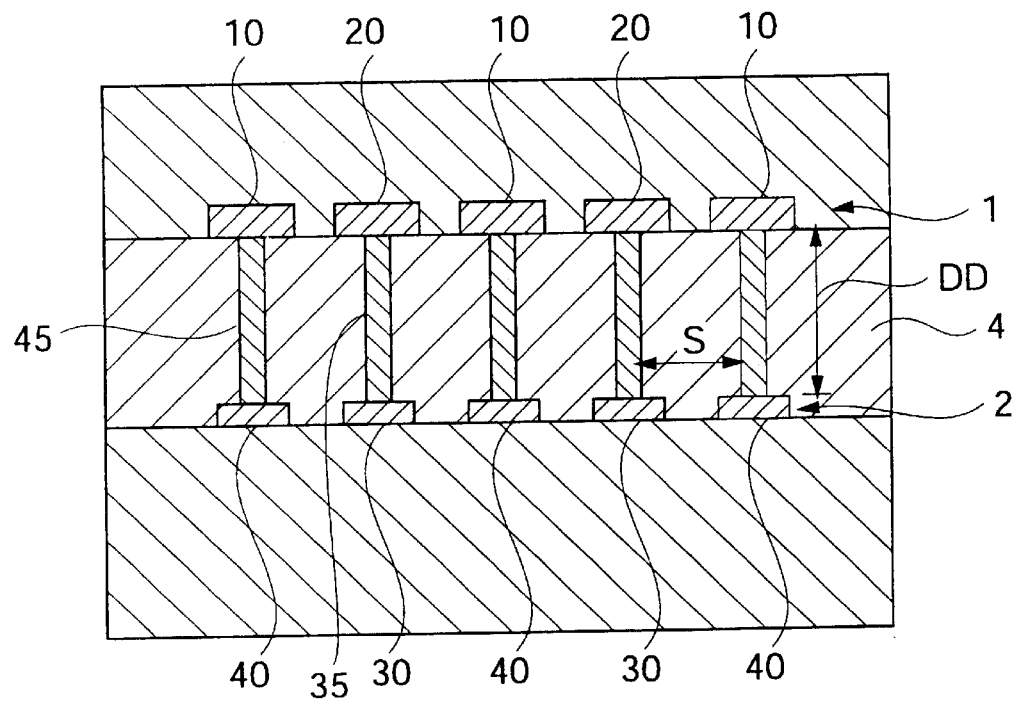
FIG. 5 is a cross-sectional view of FIG. 4.

FIG. 4 and FIG. 5 show the construction of a second embodiment of the present invention.

These drawings shows a semiconductor device provided with a first interconnect layer 1 having a first electrode 10 and a second electrode 20, and a second interconnect layer 2 having a third electrode 30 and a fourth electrode 40. The first electrode 10 has a plurality of teeth 11 and a connection portion 12 connecting the plurality of teeth 11, the second electrode 20 has a plurality of teeth 21 and a connection portion 22 connecting the plurality of teeth 21, the first electrode 10 and the second electrode 20 are disposed so as to be mutually staggered from opposite directions.

The third electrode 30 has a plurality of teeth 31 and a connection portion 32 connecting the plurality of teeth 31, the fourth electrode 40 has a plurality of teeth 41 and a connection portion 42 connecting the plurality of teeth 41, the third electrode 30 and the fourth electrode 40 are disposed so as to be mutually staggered from opposite directions.

The teeth 11 of the first electrode 10 of the first interconnect layer 1 overlap, via an intervening interlayer film 4, with the teeth 31 of the third electrode 30 or the teeth 41 of the fourth electrode 40 of the second interconnect layer 2, the teeth 11 of the first interconnect layer 1 and the teeth 41 of the second interconnect layer 2 are connected via contact holes 43 and 45, the teeth 21 of the first interconnect layer 1 and the teeth 31 of the second interconnect layer 2 are connected via contact holes 33 and 35, a capacitative element C2 being formed by the four electrodes 10 to 40.

The contact holes 35 and 45 are provided in the teeth 11 through 41 of the electrodes 10 through 40, and the contact holes 33 and 43 are provided in the connection portions of the electrodes 10 through 40.

The second embodiment of the present invention is described in further detail below, with reference being made to FIG. 4 and FIG. 5.

In FIG. 4 and FIG. 5, the conductors 10 through 40 are tooth-shaped patterns. The conductors 10 and 20 are disposed so as to be mutually staggered from opposite directions, and the conductors 30 and 40 are disposed so as to be mutually staggered from opposite directions. The conductors 10, 20 and the conductors 30, 40 are disposed so as to be mutually parallel, sandwiching a flat interlayer 4 having a film thickness of DD, and the conductors 10 and 40 are connected by the contacts 43, 45 and the conductors 20 and 30 are connected by the contacts 33, 35. FIG. 5 is a cross-sectional view along the cutting line B–B' shown in FIG. 4.

Figure 6:
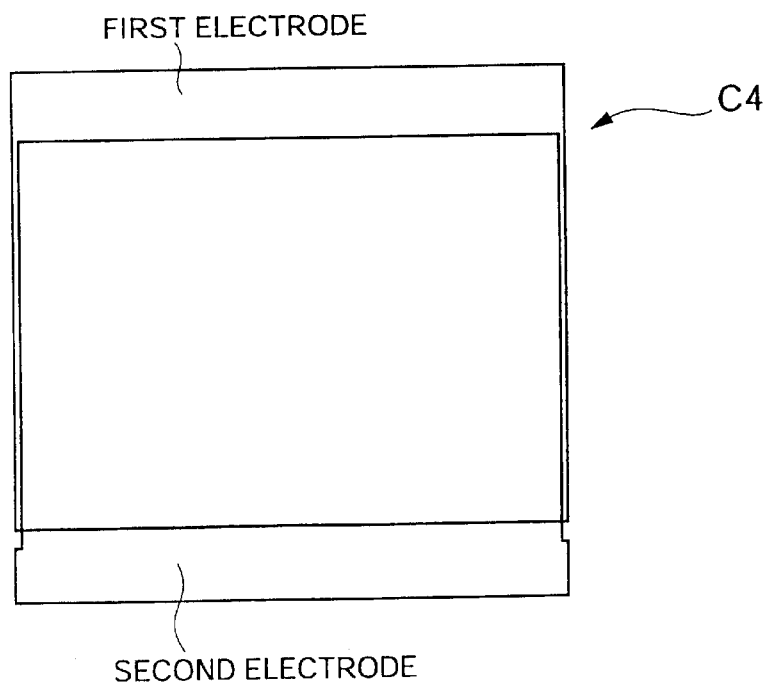
FIG. 6 is a plan view of a comparison example of the second embodiment.

If the interlayer film thickness DD between conductors 10, 20 and conductors 30, 40 is made extremely large, the effectiveness of making the upper and the lower electrode potentials mutually different as in a first embodiment is lessened. However, by providing contacts so as to connect the upper and lower electrodes, if the relationship between the interlayer film thickness DD and the spacing S between the contact connecting the conductors 40 and 10 and the contact connecting the conductors 20 and 30 is such that DD>>S, because contact side walls begin to serve as pseudo-electrodes, in the same manner as described with regard to the first embodiment, it is possible to achieve a capacitance that is larger than the capacitance of the flat-plate capacitative element C4 shown in FIG. 6.

Similar to the case of the first embodiment, taking the example of a recent DRAM, with DD=2.05 $\mu$m, S=0.84 $\mu$m and if the number of teeth of the conductor 10 and 40 and the number of teeth of the conductors 20 and 30 being 5 and 4, respectively, the capacitance of the capacitative element C2 according to the present invention is 13.0 fF. In contrast to this, the capacitance of the flat-plate capacitative element C4 having the same surface area as FIG. 6 would be only 3.2 fF.

Figure 7:
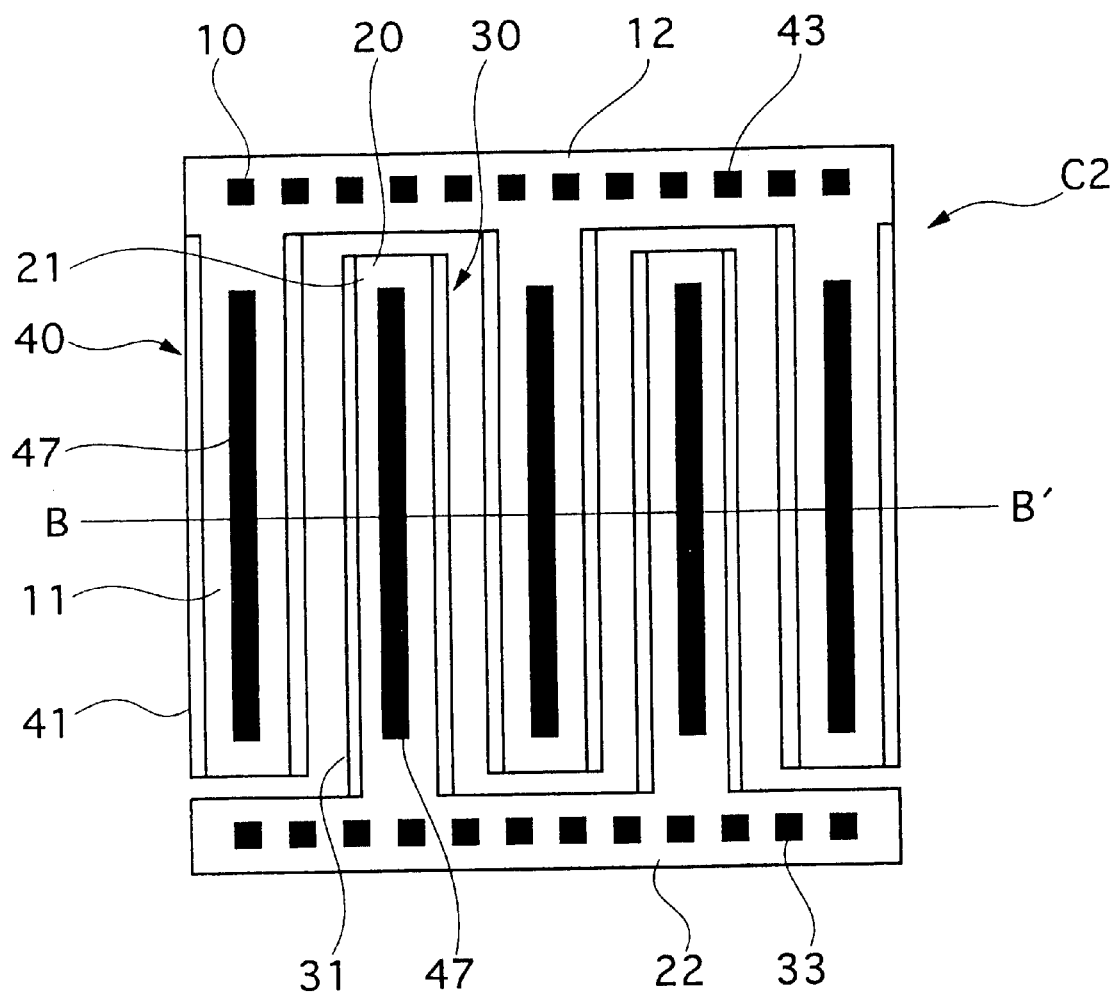
FIG. 7 is a plan view showing a variation of a second embodiment.

As shown in FIG. 7, by making the shape of the contacts 35 and 45 the rectangular shape of the contact 47, it is possible to achieve a further-enhanced effect. In this manner, if the contact shape is made rectangular, the capacitance becomes 13.3 fF.

By adopting the above-described constitution, a semiconductor device according to the present invention makes it possible to form a capacitor having sufficient ESD withstanding voltage in a small surface area.

For this reason, it is possible to reduce the element region, thereby contributing to an increase in the level of integration of a semiconductor device.

What is claimed is:

1. A semiconductor device comprising:
   a first interconnect layer comprising a first electrode and a second electrode each with a plurality of a tooth-shaped teeth and a connection portion for connecting said plurality of teeth, said first electrode and said second electrode being disposed in a mutually staggered fashion from opposite directions;
   a second interconnect layer comprising a third electrode and a fourth electrode each with a plurality of tooth-shaped teeth and a connection portion for connecting said plurality of teeth, said third electrode and said fourth electrode being disposed in mutually staggered fashion from opposite directions; and
   an intervening interlayer disposed between said first interconnect layer and said second interconnect layer;
   wherein said teeth of said first electrode of said first interconnect layer overlap, via said intervening interlayer, with either teeth of said third electrode or teeth of said fourth electrode of said second interconnect layer, and connections are made to said first electrode and said third or fourth electrodes so that potentials on said overlapping teeth are different, a capacitative element being formed by said four electrodes;
   wherein a spacing between said teeth of said first electrode and said teeth of said second electrode is smaller than a spacing between said first electrode and said third electrode or said fourth electrode.

2. A semiconductor device according to claim 1, wherein said electrodes of said first interconnect layer and said electrodes of said second interconnect layer are connected by contact holes provided in said connection portions in each said four electrodes.

3. A semiconductor device according to claim 1, wherein a width of said teeth of said first electrode or said second electrode is different from a width of said teeth of said third electrode or said fourth electrode.

4. A semiconductor device according to claim 1, wherein a width of said teeth of said first electrode or said second electrode is the same as a width of said third electrode or said fourth electrode.

5. A semiconductor device comprising:
   a first interconnect layer comprising a first electrode and a second electrode each with a plurality of a tooth-shaped teeth and a connection portion for connecting said plurality of teeth, said first electrode and said second electrode being disposed in a mutually staggered fashion from opposite directions;
   a second interconnect layer comprising a third electrode and a fourth electrode each with a plurality of tooth-shaped teeth and a connection portion for connecting said plurality of teeth, said third electrode and said fourth electrode being disposed in mutually staggered fashion from opposite directions; and
   an intervening interlayer disposed between said first interconnect layer and said second interconnect layer;
   wherein said teeth of said first electrode of said first interconnect layer overlap, via said intervening interlayer, with either teeth of said third electrode or teeth of said fourth electrode of said second interconnect layer, and connections are made to said first electrode and said third or fourth electrodes so that potentials on said overlapping teeth are different, a capacitative element being formed by said four electrodes;
   wherein a spacing between said teeth of said third electrode and said teeth of said fourth electrode is smaller than a spacing between said first electrode and said third electrode or said fourth electrode.

6. A semiconductor device comprising:
   a first interconnect layer comprising a first electrode and a second electrode each with a plurality of a tooth-shaped teeth and a connection portion for connecting said plurality of teeth, said first electrode and said second electrode being disposed in a mutually staggered fashion from opposite directions;

a second interconnect layer comprising a third electrode and a fourth electrode each with a plurality of tooth-shaped teeth and a connection portion for connecting said plurality of teeth, said third electrode and said fourth electrode being disposed in mutually staggered fashion from opposite directions; and an intervening interlayer disposed between said first interconnect layer and said second interconnect layer;

wherein said teeth of said first electrode of said first interconnect layer being disposed so as to overlap said teeth of said third electrode or said teeth of said fourth electrode of said second interconnect layer, via said intervening interlayer, and said electrodes of said first interconnect layer and said electrodes of said second interconnect layer are connected by a plurality of contact holes provided in each of said teeth of said electrodes, a capacitative element being formed by these four electrodes.

wherein a spacing between said contact holes connecting said teeth of said first electrode and said teeth of said fourth electrode and said contact holes connecting said teeth of said second electrode and said teeth of said third electrode is smaller than a spacing between said first electrode and said third electrode or said fourth electrode.

7. A semiconductor device according to claim 6, wherein said electrodes of said first interconnect layer and said electrodes of said second layer are connected by contact holes provided in said each connect portion of said four electrodes.

8. A semiconductor device according to claim 5, wherein said electrodes of said first interconnect layer and said electrodes of said second interconnect layer are connected by contact holes provided in said connection portions in each said four electrodes.

9. A semiconductor device according to claim 5, wherein a width of said teeth of said first electrode or said second electrode is different from a width of said teeth of said third electrode or said fourth electrode.

10. A semiconductor device according to claim 5, wherein a width of said teeth of said first electrode or said second electrode is the same as a width of said teeth of said third electrode or said fourth electrode.

* * * * *